United States Patent
Long

(10) Patent No.: US 9,110,128 B1
(45) Date of Patent: Aug. 18, 2015

(54) IC PACKAGE FOR PIN COUNTS LESS THAN TEST REQUIREMENTS

(75) Inventor: Jon M. Long, Livermore, CA (US)

(73) Assignee: Altera Corporation, San Jose, CA (US)

( * ) Notice: Subject to any disclaimer, the term of this patent is extended or adjusted under 35 U.S.C. 154(b) by 1061 days.

(21) Appl. No.: 12/245,653

(22) Filed: Oct. 3, 2008

(51) Int. Cl.
| | |
|---|---|
| H05K 1/18 | (2006.01) |
| H05K 7/10 | (2006.01) |
| H05K 7/12 | (2006.01) |
| G01R 31/20 | (2006.01) |
| H01R 13/24 | (2006.01) |
| H01L 23/48 | (2006.01) |
| H01L 23/52 | (2006.01) |
| H01L 29/40 | (2006.01) |
| G01R 31/28 | (2006.01) |

(52) U.S. Cl.
CPC ..................................... *G01R 31/28* (2013.01)

(58) Field of Classification Search
CPC .......... H01L 23/48; H01L 23/49; H01L 23/52
USPC .......................... 361/764, 769; 257/738, 748;
324/754.08; 439/71, 102, 331, 75, 332, 439/700
See application file for complete search history.

(56) References Cited

U.S. PATENT DOCUMENTS

| | | | |
|---|---|---|---|
| 5,057,904 | A | 10/1991 | Nagato et al. |
| 5,465,152 | A * | 11/1995 | Bilodeau et al. ............... 356/602 |
| 5,828,128 | A * | 10/1998 | Higashiguchi et al. ........ 257/738 |
| 6,107,685 | A * | 8/2000 | Nishiyama ..................... 257/737 |
| 6,456,099 | B1 * | 9/2002 | Eldridge et al. .......... 324/755.05 |
| 6,975,127 | B2 | 12/2005 | DiOrio |
| 7,061,263 | B1 * | 6/2006 | Ong ............................. 324/750.3 |
| 7,180,318 | B1 * | 2/2007 | Mahoney et al. ......... 324/756.03 |
| 7,400,134 | B2 * | 7/2008 | Morishita et al. ......... 324/762.02 |
| 7,811,096 | B2 * | 10/2010 | Takagi ............................. 439/71 |
| 2001/0000947 | A1 | 5/2001 | Swart et al. |
| 2006/0060959 | A1 * | 3/2006 | Hayashi et al. ................ 257/758 |
| 2007/0066094 | A1 * | 3/2007 | Kim et al. ........................ 439/71 |
| 2008/0054261 | A1 * | 3/2008 | Song et al. ....................... 257/48 |
| 2008/0157076 | A1 * | 7/2008 | Jeong ............................... 257/48 |

FOREIGN PATENT DOCUMENTS

| | | |
|---|---|---|
| CN | 2512114 Y | 9/2002 |
| CN | 1798977 A | 7/2006 |
| JP | 07302930 A | 11/1995 |

OTHER PUBLICATIONS

Definition of "adjacent" from www.merriam-webster.com Mar. 14, 2014.*
State Intellectual Property Office PRC, Third Office Action for CN200910178992.6, issued May 4, 2014.

* cited by examiner

*Primary Examiner* — Chau N Nguyen
*Assistant Examiner* — Roshn Varghese
(74) *Attorney, Agent, or Firm* — Womble, Carlyle, Sandridge & Rice

(57) ABSTRACT

An integrated circuit (IC) package with a plurality of contact leads and a plurality of contact pads disposed on a surface of the IC package is disclosed. The contact pads may be used as test probes for testing the IC. Having a plurality of contact pads may create more test locations on the IC package. The size of the IC package may also be reduced by using contact pads instead of contact leads for testing. A socket body for the IC package is also disclosed. The socket body has a plurality of contactors extending outward from the socket body. The contactors may have different heights to contact each of the contact pads and contact leads on the IC package. The contactors may be adjustable to different heights. In some embodiments, a portion of the contactors may be compressed when and IC package is placed in the socket body.

21 Claims, 7 Drawing Sheets

IC PACKAGE FOR PIN COUNTS LESS THAN TEST REQUIREMENTS

BACKGROUND

The present invention relates generally to integrated circuits (ICs). More specifically, the invention relates to IC packages with additional contact points without increasing the size of the IC package.

Integrated circuits are used in almost all digital systems. Different types of integrated circuits with different types of packages cater to the needs of various applications. As portable applications like digital cameras and mobile phones require extremely small form-factors, the size of the device used in many of these applications should be minimized. Normally, the size of the device used is determined by the I/O requirement of the application that the device is used for. For example, an application that needs to have a certain number of I/Os will need to use a device that can meet that requirement. As these devices need to go through a series of tests, there needs to be resources on the device for testing. Therefore, the package of the device needs to have a sufficient number of leads to accommodate a variety of requirements.

The I/O requirement for a design is usually more than what is needed to test the device. A bigger package is generally needed when more I/Os are needed in a design. However, there are also cases where the total I/O requirement is less than what is needed to fully test the device. Therefore, the smallest device/package combination is determined by the minimum amount of test pins required to test the device in the package. Test requirements or test I/Os needed to test an IC device in a package is generally limited to the number of leads on the package. For example, a design might need only 16 I/Os but the minimum test requirement for the device used might be more than 16 I/Os. Hence, the minimum package size will be determined by the test requirement in this case because more leads are needed for testing than for I/Os. In other words, the lead count on a package must fulfill not only the I/O requirement of a design, but also the number of test pins needed to test the device in the package.

If the test program needed for testing an IC or a design requires more I/Os than available on a given package, then the device/package combination cannot be made. The size of a device, and subsequently the size of the package of the device, is therefore generally determined by the I/O requirement of a design. In cases where the total number of I/Os required in a design is less than the number of test pins needed to test the device used, the size of the package is still determined by the number of test pins needed and not the actual I/O requirement. It is not possible to use a smaller package even though the number of I/Os needed is significantly less.

However, because the size of the device and subsequently, the size of the package matters in some cases, the ability to have a device/package combination with less I/O count than is required for testing is desired. It is also advantageous to have a smaller package size which is not limited by the number of leads needed for testing the device in the package. It is further desirable to have leads of different elevations and to have the ability to test a device in a package at different elevations so that custom packages with the minimum required lead count can be used without affecting the test requirements for the IC device.

SUMMARY

Embodiments of the present invention include apparatuses and a process for creating an IC package and a socket for an IC package. It should be appreciated that the present invention can be implemented in numerous ways, such as a process, an apparatus, or a device. Several inventive embodiments of the present invention are described below.

In one embodiment, an IC package is disclosed. A surface of the IC package has a plurality of contact leads. The same surface also has a plurality of contact pads. The contact leads have a first elevation on the surface of the IC package and the contact pads have a second elevation on the surface of the IC package. In some embodiments, the contact pads are smaller in size compared to the contact leads on the IC package. In one embodiment, the contact leads on the IC package are arranged in a grid pattern and the contact pads are placed adjacent to the contact leads.

In another embodiment, a socket for an IC package is described. The socket has a socket body with a plurality of contactors extending outward from a surface of the socket body. A portion of the contactors have a first height and another portion of the contactors have a second height. The contactors are used for contacting leads on the IC package. In some embodiments, the height of the contactors can be adjusted. In other embodiments, the height of the contactors is fixed and cannot be adjusted.

In another aspect of the present invention, an IC package prepared by a process is disclosed. A plurality of contact leads with a first height is disposed onto a surface of the IC package in the process. A plurality of contact pads with a second height is also disposed onto the surface of the IC package in the disclosed process. The plurality of contact leads and the plurality of contact pads are configured to connect to a plurality of contactors.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe a package for an integrated circuit (IC), a socket for an IC package, and a process for creating an IC package with a lower lead count. It will be obvious, however, to one skilled in the art, that the present invention may be practiced without some or all of these specific details. In other instances, well-known operations have not been described in detail in order not to unnecessarily obscure the present invention.

Embodiments described herein provide an IC package with a lower lead count and a socket for an IC package and a process to produce an IC package with a lower lead count than is required for testing. By placing test pads in between leads on the package, more test locations are created when needed. This way, the size of the package can be reduced when the size of the package is not limited to the number of test pins needed to test the device in the package. At the same time, the test requirement will still be met because the test pads, which are usually smaller in size, can be used as test probes for testing the device. In the embodiments described below a package configuration and test socket are provided for more effective high speed testing. In one embodiment, interstitial probe pads are disposed between or among existing package solder balls of the package of the integrated circuit. These probe pads are accessed through contactors of the test socket having different elevations so that the interstitial probe pads, as well as the solder balls, are contacted, thereby enabling complete testing for a package having less leads than may be required for the testing.

Figure 1:
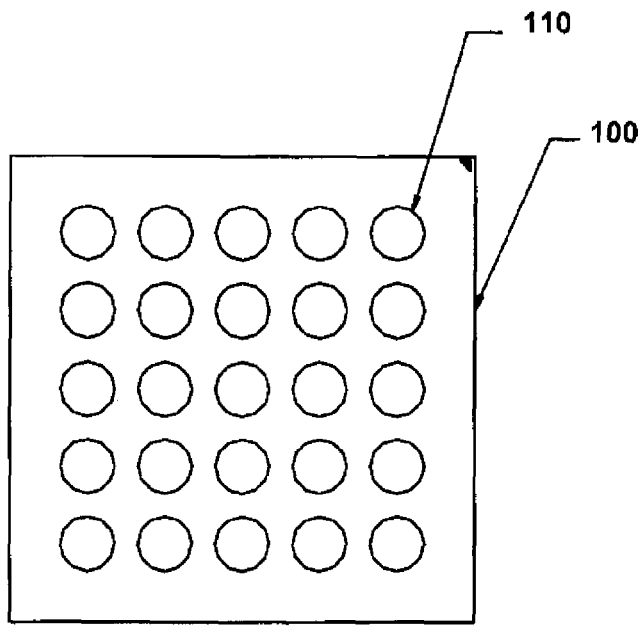
FIG. 1, meant to be illustrative and not limiting, shows a bottom surface of an example IC package.
Figure 1A:
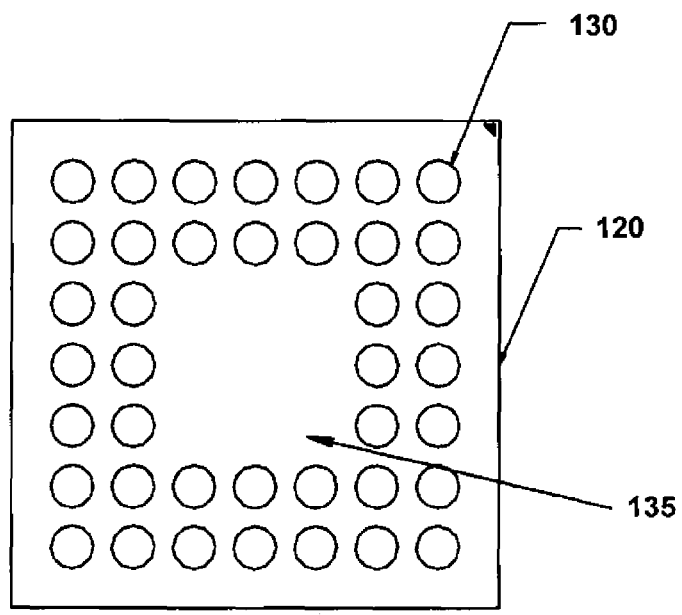
FIG. 1A, as an illustrative example, shows an exemplary partial array IC package.

FIG. 1, meant to be illustrative and not limiting, shows a bottom surface of an example IC package 100. The package 100 has a plurality of contact leads 110. The contact leads 110 are arranged in a grid array. FIG. 1A, as an illustrative example, shows a partial array IC package 120. The package 120 has a plurality of contact leads arranged around the perimeter of the IC package 120. There is however, an empty space 135 in the center of the package 120. IC package 100 and IC package 120 both are standard packages where test I/Os are limited by the number of leads on the package. For instance, the number of test I/Os on package 100 is limited by the number of contact leads 110 on the package 100, and likewise, the number of test I/Os on package 120 is limited by the number of contact leads 130 on the package 120.

Figure 2:
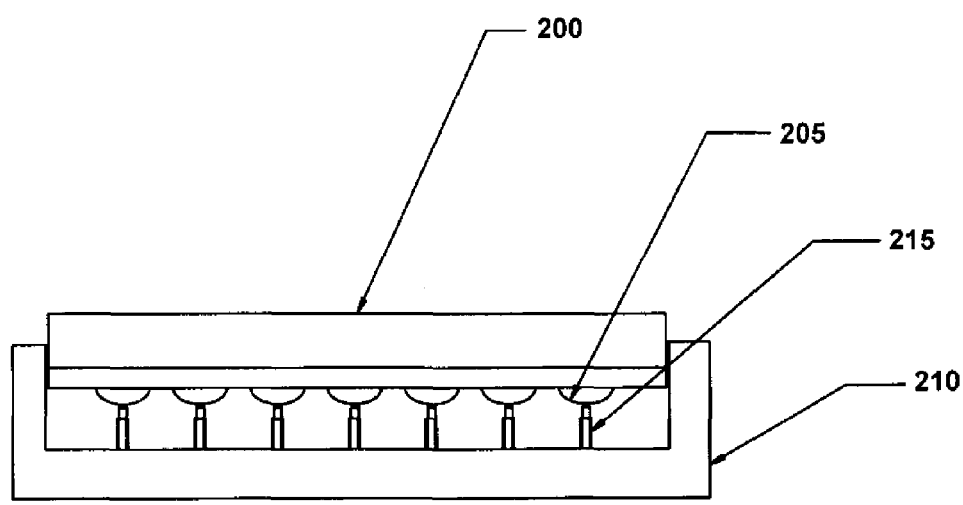
FIG. 2 shows a side view of an example IC package placed on a socket body.

FIG. 2 shows a side view of an existing IC package 200 placed on a socket body 210. The contact leads 205 on the package 200 are connected to the tips of the contactors 215 extending from the socket body 210. The contactors 215 are all of the same height and have points or tips at the same elevation. Therefore, the contact leads 205 that are connected to these contactors 215 are of the same elevation on the package 200. The contact leads 205 provide contact points for the contactors 215. If a test program requires more I/Os than available on the package, then the device/package cannot be made. It is also not possible to have a device/package of the same size but with more I/Os with such a configuration where all the test locations, or contact leads 205 are at the same elevation and test contactors 215 are designed for contacting leads at the same elevation on a plane.

Figure 3:
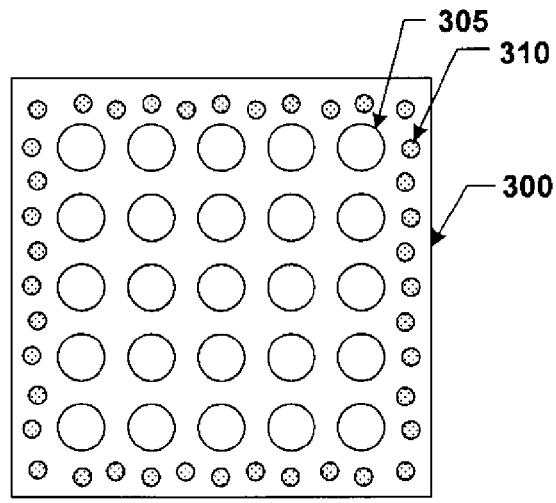
FIG. 3, meant to be illustrative and not limiting, shows an IC package in accordance with an embodiment of the present invention.

FIG. 3, meant to be illustrative and not limiting, shows an IC package 300 in accordance with an embodiment of the present invention. The package 300 has a plurality of contact leads 305 arranged in a grid array on the surface of the package 300. In one embodiment, the package 300 is a ball grid array (BGA) package and the contact leads 305 are solder balls. A plurality of contact pads is also placed on the surface of the package 300. As an illustrative example shown in FIG. 3, the contact pads 310 surround the perimeter of the IC package 300. In one embodiment, the contact pads 310 are smaller in dimension compared to the contact leads 305 and are used as test probes for testing the device. In some embodiments, the contact pads 310 are flat pads on the surface of the package 300. Contact pads 310 may have any suitable geometric shape and are not limited to the exemplary circular shape illustrated. Even though a specific number of contact leads 305 and contact pads 310 are shown in. FIG. 3, one skilled in the art should appreciate that there can be fewer or more contact leads 305 and contact pads 310 used in an IC package.

Figure 3A:
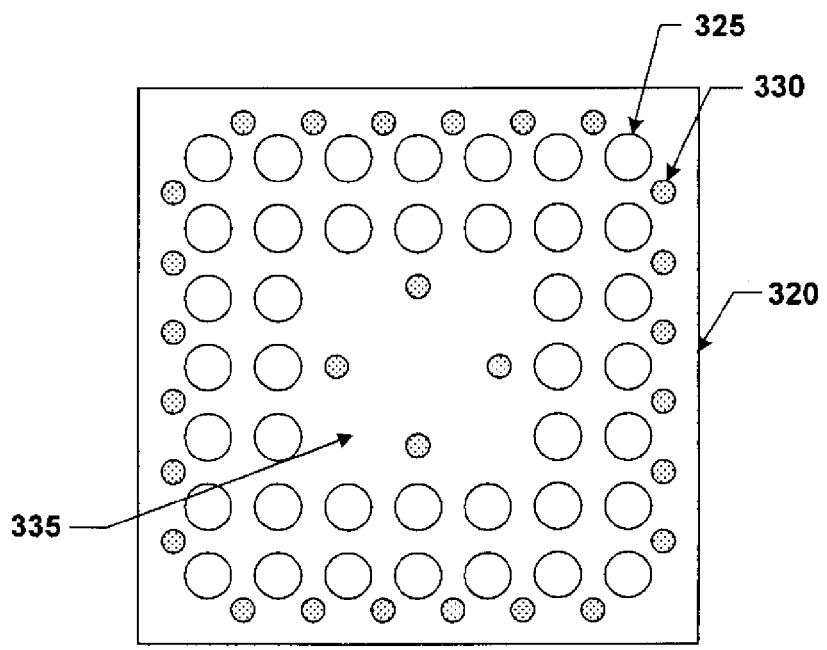
FIG. 3A, meant to be illustrative and not limiting, shows a partial array IC package in accordance with an embodiment of the present invention.

FIG. 3A, meant to be illustrative and not limiting, shows a partial array IC package 320 in accordance with an embodiment of the present invention. The package 320 has a plurality of contact leads 325 arranged in a grid array on the surface of the package 320 and leaving an empty area 335 in the center of the surface. Contact pads 330 are arranged around the perimeter of the package 320. A plurality of contact pads 330 is also placed in the empty area 335 on the surface of the IC package 320. Even though only a specific number of contact pads 330 are shown in FIG. 3A, one skilled in the art should appreciate that more contact pads can be placed if desired. In some embodiments, the contact pads 330 can be used to create more test locations on the IC package 320.

Figure 3B:
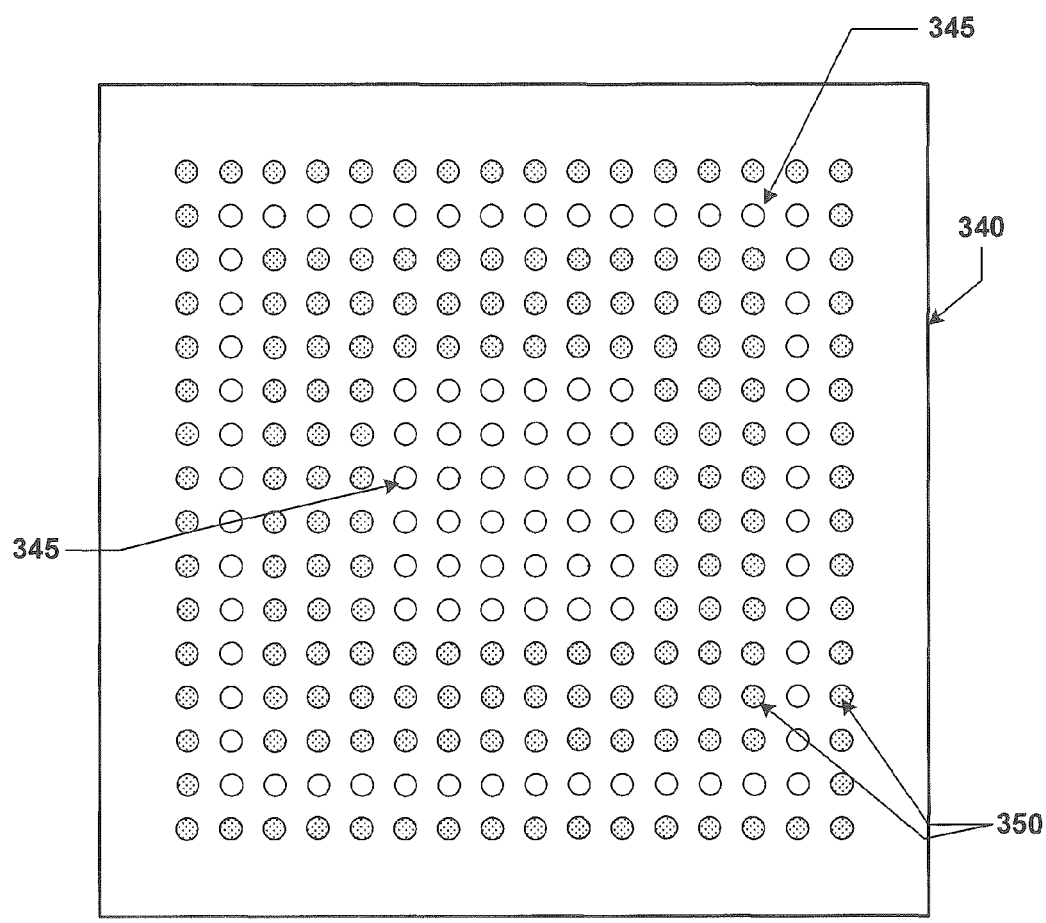
FIG. 3B, meant to be illustrative and not limiting, shows an IC package with a plurality of contact leads and contact pads arranged in a specific manner as another embodiment of the present invention.

FIG. 3B, meant to be illustrative and not limiting, shows an IC package 340 with a plurality of contact leads 345 and contact pads 350 arranged in a specific manner as another embodiment of the present invention. In one embodiment, the contact leads 345 are solder balls and the IC package 340 is a BGA package. One skilled in the art should appreciate that the contact leads 345 and contact pads 350 can be arranged differently on an IC package. A plurality of contact leads 345 are arranged in a grid array and placed in the center of the IC package 340. A plurality of contact pads 350 surrounds the contact leads 345 at the center of the package 340. A portion of the contact leads 345 are arranged around a perimeter of the IC package 340 with a portion of the contact pads 350 arranged around the inner perimeter of the package 340. In certain embodiments, the number of contact pads 350 is more than the number of contact leads 345. In other embodiments, the number of contact leads 345 is more than the number of contact pads 350. In yet another embodiment, the plurality contact leads 345 and the plurality solder contact pads 350 differ in size.

Figure 4:
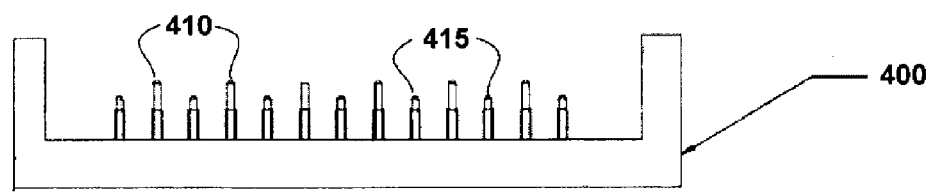
FIG. 4, meant to be exemplary and not limiting, shows a socket body as an embodiment of the present invention.

FIG. 4, meant to be exemplary and not limiting, shows a socket body 400 as an embodiment of the present invention. The socket body 400 has a plurality of contactors 410 and 415. The contactors 410 and 415 extend from the socket body. As shown in FIG. 4, in one embodiment, the contactors are of different heights. In another embodiment, the height of the contactors 410 and contactors 415 is fixed and cannot be adjusted. In other embodiments, the height of the contactors 410 and contactors 415 is adjustable. A portion of the contactors 410 are higher than another portion of the contactors 415. In one embodiment, the contactors 410 and the contactors 415 are test contactors used for testing an IC device.

Figure 4A:
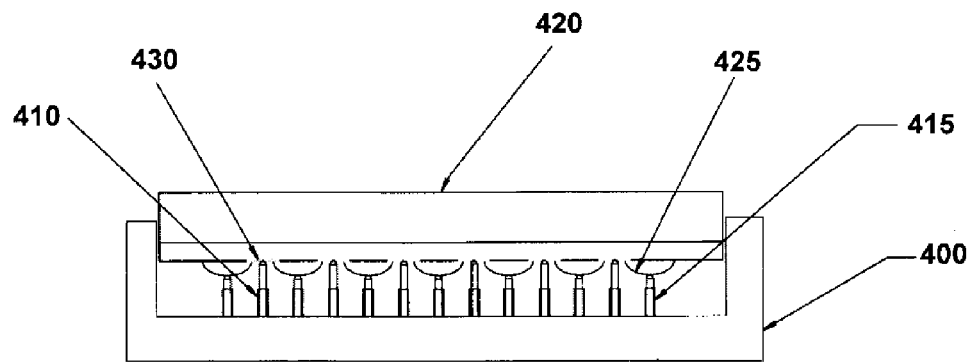
FIG. 4A, meant to be exemplary and not limiting, shows an IC package placed on the socket body of FIG. 4 in accordance with one embodiment of the invention.

FIG. 4A, meant to be exemplary and not limiting, shows an IC package 420 placed in the socket body 400. The IC package 420 has a plurality of contact leads 425 and a plurality of contact pads 430. The plurality of contact leads 425 and the plurality of contact pads 430 are configured such that when the IC package 420 is placed on a socket body 400, each of the contact leads 425 touches, or makes contact with, a tip of the contactor 410 and each of the contact pads 430 touches a tip of the contactor 415. In one embodiment, the contact pads 430 are used as test probes for testing the IC device.

Figure 5:
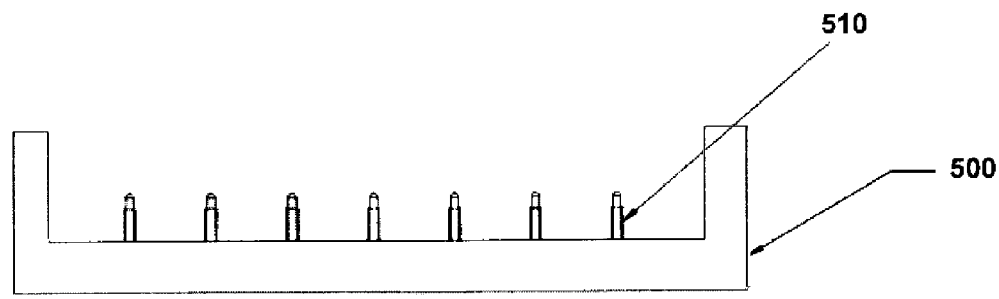
FIG. 5, meant to be exemplary and not limiting, shows a socket body with a plurality of contactors in another embodiment in accordance with the present invention.

FIG. 5, meant to be exemplary and not limiting, shows a socket body 500 with a plurality of contactors 510 in another embodiment in accordance with the present invention. As an exemplary embodiment shown in FIG. 5, each of the plurality of contactors 510 is the same height. In some embodiments, the plurality of contactors 510 can be extended. In other embodiments, the plurality of contactors 510 has a spring-like mechanism and each of the contactors 510 may be compressed by an IC package placed in the socket body 500. That is, the contactors 510 may be spring loaded and thus are enabled to be compliant to adopt to variations in height. It should be appreciated that the spring mechanism provides sufficient residency so as to make proper electrical contact with a corresponding lead or pad.

Figure 5A:
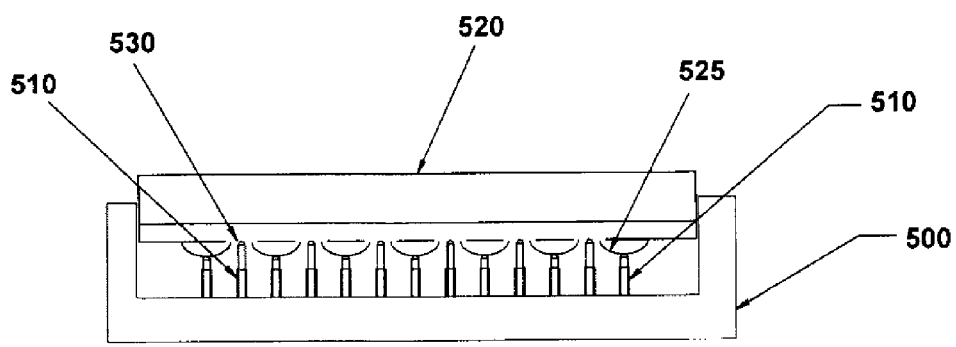
FIG. 5A, as an illustrative example, shows an IC package in accordance with an embodiment of the present invention placed on the socket body of FIG. 4.

FIG. 5A, as an illustrative example, shows an IC package 520 placed in the socket body 500. The IC package 520 has a plurality of contact leads 510 and a plurality of contact pads 530 disposed on a surface of the IC package 520. In one embodiment, the IC package 520 is a ball-grid array (BGA) package. The IC package 520 is placed such that each of the contact pads 530 touches a tip of the contactors 510 and each of the contact leads 525. In certain embodiments, the contact leads 525 and the contact pads 530 are disposed at different elevations on the surface of the IC package 520. In some of these embodiments, a portion of the contactors 510 are extended so that tips of the contactors 510 are connected to the contact pads 530. In other embodiments, some of the contactors 510, which are of the same height as shown in FIG. 5, are depressed by the plurality of contact leads 525 on the IC package 520 when the IC package 520 is engaged in the socket 500. In an exemplary embodiment, the contact leads 525 are thicker than the contact pads 530. In this embodiment, a portion of the contactors will be compressed by the contact leads 525 when the IC package 520 is placed in the socket body 500.

Figure 6:
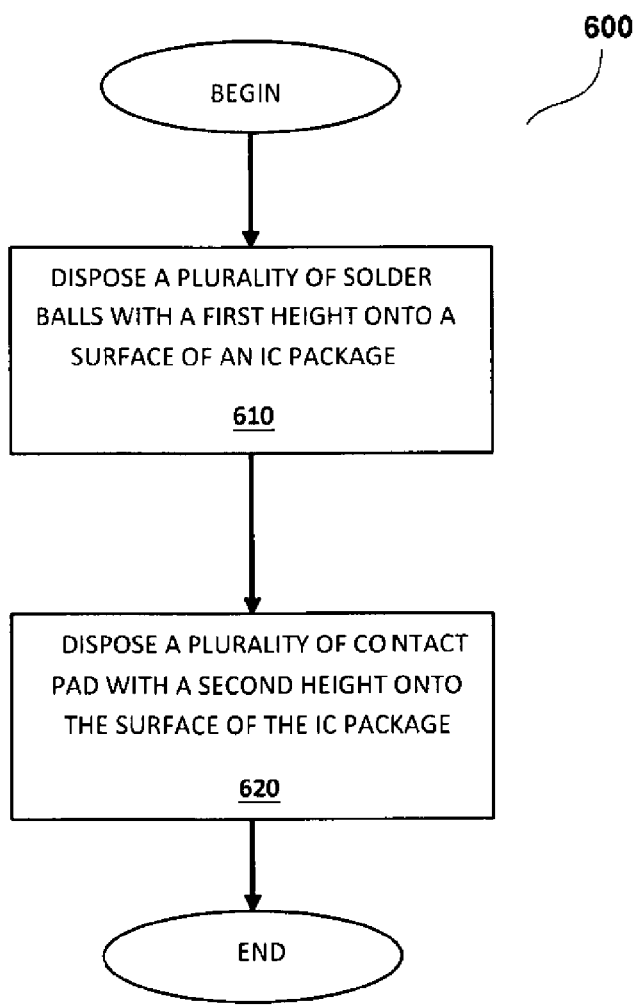
FIG. 6 shows a process flow as another embodiment of the present invention.

FIG. 6, shows a process flow 600 as another embodiment of the present invention. A plurality of contact leads is disposed on a surface of an IC package in operation 610. In some embodiments, the contact leads are disposed in a grid array on the surface of the IC package. A plurality of contact pads is then disposed on the same surface of the IC package in operation 620. In one embodiment, the number of contact leads disposed on the surface of the IC package is enough to fulfill the I/O requirement of the device but is not enough to fully fulfill the test requirement of the device. In one embodiment, the plurality of contact pads are used as test probes to fulfill the test requirement of the device. The plurality of contact leads and contact pads disposed on the surface of the IC package form bumps of different elevations on the surface of the IC package. The contact leads and contact pads are configured to connect to contactors on a socket body, which accommodate the different elevations on the IC package surface. In some embodiments, the contact pads are used to program the IC when one or more programming pins are routed to the contact pads instead of the contact leads. As an exemplary embodiment, the programming pins routed to the contact pads may be Joint Test Action Group (JTAG) pins. Routing programming pins to contact pads instead of contact leads may increase the number of I/Os on the device as it would be possible to route I/O pins to the contact leads that had the programming pins. Therefore, the total number of I/Os could be increased by routing some of the programming pins to contact pads.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) package, comprising: a surface of said IC having a plurality of contact leads disposed thereon, wherein the plurality of contact leads comprises solder balls affixed to the surface of the IC package; and a plurality of contact pads disposed on the surface of the IC package, wherein the plurality of contact pads is adjacent to the plurality of contact leads, wherein the plurality of contact pads comprises a substantially flat outer surface extending from the surface of the IC package, wherein the outer surface of each contact pad of the plurality of contact pads extends from the surface of the IC package by a first elevation and a surface of each of the solder balls of the plurality of contact leads extends from the surface of the IC package by a second elevation; a socket body having a plurality of test pins, wherein a first portion of the plurality of test pins is configured to contact the plurality of contact pads when engaged with the IC package and a second portion of the plurality of test pins is configured to contact the plurality of contact leads when engaged with the IC package, wherein each test pin of the first portion of the plurality of test pins and each test pin of the second portion of the plurality of test pins are adjustable in height to accommodate the first elevation and the second elevation, respectively, when engaged with the IC package, and wherein a first portion of the plurality of contact leads forming a first ring of contact leads is arranged in an inner perimeter area of the surface of the IC package, the first ring of contact leads is exclusive of any contact pads, and a first portion of the plurality of contact pads forming a first ring of contact pads along an outermost perimeter area and the first ring of contact pads is exclusive of any contact leads, and wherein the first ring of contact pads is arranged adjacent to the first ring of contact leads, wherein at least a second portion of the plurality of contact leads forming a second ring of contact leads is arranged adjacent to first ring of contact pads on the surface of the IC package, the second ring of contact leads exclusive of any contact pads, wherein at least a third portion of the plurality of contact leads is arranged in a grid pattern on the surface of the IC package and is located in a center area of the surface of the IC package, wherein at least a second portion of the plurality of contact pads forming a second ring of contact pads is arranged between the second ring of contact leads and the third portion of the plurality of contact leads on the surface of the IC package.

2. The IC package of claim 1, wherein the first elevation associated with the outer surface of each contact pad of the plurality of contact pads is lower than the second elevation associated with the surface of each contact lead of the plurality of contact leads.

3. The IC package of claim 1, wherein the plurality of test pins extend outward from the socket body, wherein the IC package is configured to be placed such that the plurality of contact leads and the plurality of contact pads on the IC package are adjacent to the plurality of test pins on the socket body, and wherein each contact lead of the plurality of contact leads and each contact pad of the plurality of contact pads contacts a tip of a test pin.

4. The IC package of claim 1, wherein at least another portion of the plurality of contact pads is located in a center area of the surface of the IC package.

5. The IC package of claim 1, wherein at least another portion of the plurality of contact pads is positioned such that the another portion of the plurality of contact pads is located between two or more contact leads.

6. The IC package of claim 1, wherein a number of contact pads is greater than a number of contact leads.

7. The IC package of claim 1, wherein a number of contact leads is greater than a number of contact pads.

8. The IC package of claim 1, wherein the plurality of contact pads comprise test probes used for testing the IC.

9. The IC package of claim 1, wherein a number of contact leads disposed on the surface of the IC package is less than a number of contact leads needed for testing the IC.

10. A socket, comprising: a socket body; and a plurality of contactors extending outward from a surface of the socket body, the plurality of contactors configured for testing an integrated circuit (IC) package, wherein the IC package comprises: a surface having plurality of solder balls affixed to a surface of the IC package, wherein said plurality of solder balls is arranged in a ball and grid array; and a plurality of pads disposed on the surface of the IC package, the plurality of pads having a substantially flat outer surface extending from the surface of the IC package, wherein the outer surface of each pad of the plurality of pads extends from the surface of the IC package by a first elevation and a surface of each solder ball of the plurality of solder balls extends from the surface of the IC package by a second elevation; wherein a first portion of the plurality of contactors is configured to contact the plurality of pads when engaged with the IC package and a second portion of the plurality of contactors is configured to contact the plurality of solder balls when engaged with the IC package, wherein each contactor of the first portion of the plurality of contactors and each contactor of the second portion of the plurality of contactors are adjustable in height to accommodate the first elevation and the second elevation, respectively, when engaged with the IC package, and wherein a first portion of the plurality of solder balls forming a first ring of solder balls is arranged along an outermost perimeter area of the surface of the IC package, and the first ring of solder balls is exclusive of any pads and a first portion of the plurality of pads forming a first ring of pads is arranged adjacent to the first ring of solder balls in an inner perimeter area of the surface of the IC, the first ring of pads exclusive of any solder balls, wherein at least a second portion of the plurality of solder balls forming a second ring of solder balls is arranged adjacent to first ring of pads on the surface of the IC package, the second ring of solder balls exclusive of any pads, wherein at least a third portion of the plurality of solder balls is arranged in a grid pattern on the surface of the IC package and is located in a center area of the surface of the IC package, wherein at least a second portion of the plurality of pads forming a second ring of pads is arranged between the second ring of solder balls and the third portion of the plurality of solder balls on the surface of the IC package.

11. The socket of claim 10, wherein the first elevation and the second elevation are fixed.

12. The socket of claim 10, wherein the first portion of the plurality of contactors is compressed to adjust to the first elevation associated with the plurality of pads on the IC package when the IC package is engaged in the socket and the second portion of the plurality of contactors is compressed to adjust to the second elevation associated with the plurality of solder balls on the IC package when the IC package is engaged in the socket.

13. The socket of claim 10, wherein each solder ball of the plurality of solder balls and each pad of the plurality of pads are coupled to a tip of a contactor on the socket body when the IC package is engaged with the socket body.

14. The socket of claim 13, wherein each pad of the plurality of pads is disposed between two or more solder balls.

15. An integrated circuit (IC) package prepared by a process, the process comprising: disposing a plurality of solder balls having a first height onto a surface of the IC package; and disposing a plurality of contact pads having a second height onto the surface of the IC package, wherein each contact pad of the plurality of contact pads comprises a substantially flat top surface, wherein the plurality of contacts pads is coupled to circuitry within the IC, and wherein a contact pad of the plurality of contact pads is disposed between multiple adjacent solder balls; wherein the IC package is dimensioned to fit a socket body having a plurality of contactors, wherein a first portion of the plurality of contactors is configured to contact the plurality of solder balls when engaged with the IC package and a second portion of the plurality of contactors is configured to contact the plurality of contact pads when engaged with the IC package, wherein each contactor of the first portion of the plurality of contactors and each contactor of the second portion of the plurality of contactors are adjustable in height to accommodate the height and the second height, respectively, when engaged with the IC package, and wherein a first portion of the plurality of solder balls forming a first ring of solder balls is arranged along an outermost perimeter area of the surface of the IC package, and the first ring of solder balls is exclusive of any contact pads and a first portion of the plurality of contact pads forming a first ring of contact pads is arranged adjacent to the first ring of solder balls in an inner perimeter area of the surface of the IC, the first ring of contact pads exclusive of any solder balls, wherein at least a second portion of the plurality of solder balls forming a second ring of solder balls is arranged adjacent to first ring of contact pads on the surface of the IC package, the second ring of solder balls exclusive of any contact pads, wherein at least a third portion of the plurality of solder balls is arranged in a grid pattern on the surface of the IC package and is located in a center area of the surface of the IC package, wherein at least a second portion of the plurality of contact pads forming a second ring of contact pads is arranged between the second ring of solder balls and the third portion of the plurality of solder balls on the surface of the IC package.

16. The IC package of claim 15, wherein the plurality of contact pads on the IC package comprises test probes for testing an IC.

17. The IC package of claim 15, wherein a number of solder balls of the plurality of solder balls is less than a number of test probes required for testing an IC disposed within the IC package.

18. The IC package of claim 15 further comprising:
using one or more contact pad of the plurality of contact pads to program the IC, wherein one or more programming pins of the IC is coupled to the one or more contact pads of the plurality of contact pads instead of one or more of the plurality of solder balls.

19. The IC package of claim 18, wherein the one or more programming pins routed to the one or more contact pads of the plurality of contact pads is Joint Test Action Group (JTAG) pins.

20. The IC package of claim 18, wherein one or more I/O pins of the IC is coupled to the one or more of the plurality of solder balls.

21. The IC package of claim 15, wherein at least one contact pad of the plurality of contact pads is used to configure the IC.

* * * * *